United States Patent
Likhanskii et al.

(10) Patent No.: US 12,249,488 B2
(45) Date of Patent: Mar. 11, 2025

(54) PLASMA SHAPER TO CONTROL ION FLUX DISTRIBUTION OF PLASMA SOURCE

(71) Applicant: Applied Materials, Inc., Santa Clara, CA (US)

(72) Inventors: Alexandre Likhanskii, Malden, MA (US); Peter F. Kurunczi, Cambridge, MA (US); Alan V. Hayes, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 328 days.

(21) Appl. No.: 17/686,200

(22) Filed: Mar. 3, 2022

(65) Prior Publication Data

US 2023/0282449 A1    Sep. 7, 2023

(51) Int. Cl.
*H01J 37/32*    (2006.01)

(52) U.S. Cl.
CPC ...... *H01J 37/32422* (2013.01); *H01J 37/321* (2013.01); *H01J 37/32623* (2013.01); *H01J 37/3244* (2013.01)

(58) Field of Classification Search
CPC .............. H01J 37/32422; H01J 37/321; H01J 37/32623; H01J 37/3244; H01J 37/3211; H01J 37/32357; H01J 37/32449; H01J 37/32458

See application file for complete search history.

(56) References Cited

U.S. PATENT DOCUMENTS

| | | |
|---|---|---|
| 5,569,363 A | 10/1996 | Bayer |
| 7,183,716 B2 | 2/2007 | Kanarov et al. |
| 8,703,001 B1 | 4/2014 | Hegde |
| 9,899,193 B1 * | 2/2018 | Koo ............ H01J 37/32449 |
| 2012/0211166 A1 | 8/2012 | Yevtukhov |
| 2014/0124363 A1 * | 5/2014 | Abarra ............ C23C 14/46 |
| | | 204/298.04 |

(Continued)

FOREIGN PATENT DOCUMENTS

| | | |
|---|---|---|
| EP | 0939972 B1 | 4/2011 |
| JP | 2002334800 A | 11/2002 |

(Continued)

OTHER PUBLICATIONS

Taiwanese Search Report for Application No. 112106565 dated Dec. 7, 2023.

(Continued)

*Primary Examiner* — Aiden Lee
(74) *Attorney, Agent, or Firm* — KDW FIRM PLLC (57) ABSTRACT

Provided herein are approaches for providing a more uniform ion flux and ion angular distribution across a wafer to minimize etch yield loss resulting from etch profile variations. In some embodiments, a system may include a plasma source operable to generate a plasma within a plasma chamber enclosed by a chamber housing, wherein the plasma source comprises a plasma shaper extending into the plasma chamber from a wall of the chamber housing. The plasma shaper may include a shaper wall coupled to the wall of the chamber housing, and a shaper end wall connected to the shaper wall, the shaper end wall defining an indentation extending towards the wall of the chamber housing.

10 Claims, 11 Drawing Sheets

(56) References Cited

U.S. PATENT DOCUMENTS

| | | |
|---|---|---|
| 2016/0181118 A1 | 6/2016 | Kudou |
| 2018/0138020 A1* | 5/2018 | Koo ................. H01J 37/32412 |
| 2018/0358206 A1* | 12/2018 | Ma ........................... B08B 5/00 |
| 2019/0131112 A1 | 5/2019 | Ma |
| 2021/0050213 A1* | 2/2021 | Savas ................ H01J 37/32321 |
| 2022/0068611 A1* | 3/2022 | Long ................ H01J 37/32357 |

FOREIGN PATENT DOCUMENTS

| | | |
|---|---|---|
| TW | 201624561 A | 7/2016 |
| TW | 202123301 A | 6/2021 |

OTHER PUBLICATIONS

International Search Report and Written Opinion for the International Application No. PCT/US2023/013031, mailed May 30, 2023, 12 pages.

\* cited by examiner

PLASMA SHAPER TO CONTROL ION FLUX DISTRIBUTION OF PLASMA SOURCE

FIELD OF THE DISCLOSURE

The disclosure relates generally to techniques for manufacturing electronic devices, and more particularly, to using a plasma shaper to control ion flux distribution of a plasma source.

BACKGROUND OF THE DISCLOSURE

Charged particle treatment of substrates is used in a variety of applications. One specific application is ion beam etching of substrates having features with extreme critical dimension uniformity and symmetry requirements. In such processes, the substrate may be positioned at one or more angles to the beam. Depending on the application, the substrate may be required to be held statically at one or more fixed angle(s), or may be moved in front of the beam (e.g., tilted and/or rotated) during a single substrate process cycle to improve the substrate treatment uniformity.

The reduction of critical dimensions of thin film devices has increased the need for process uniformity, as well as better control of beam collimation. At the same time, reduction in device size has required better control of device critical dimensions that are a function of the ion bombardment process, such as the average wall angle of an etched structure. As a result, high process uniformity (e.g., etch depth) is desirable, wherein uniformity is directly related to the particle flux, i.e., the beam current density.

Thus, there is a need for a charged particle source for treating a substrate with reduced angular dispersion of the charged particles across a large substrate, while also maintaining high uniformity across the substrate at any angle to the beam. There is a further need for a charged particle source that is "tunable" to compensate for variations due to part tolerances as well as changes in source performance with time.

It is with respect to these and other considerations, the present disclosure is provided.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In one embodiment, a system may include a plasma source operable to generate a plasma within a plasma chamber enclosed by a chamber housing, wherein the plasma source is a radio frequency inductively coupled plasma source, and wherein the plasma source comprises a plasma shaper extending into the plasma chamber from a wall of the chamber housing. The plasma shaper may include a shaper wall coupled to the wall of the chamber housing, and a shaper end wall connected to the shaper wall, the shaper end wall defining an indentation extending towards the wall of the chamber housing.

In another embodiment, an ion beam processing system may include a plasma source operable to generate a plasma within a chamber housing, wherein the plasma source is a radio frequency inductively coupled plasma source, and an extraction power assembly including a high voltage power supply electrically coupled to the chamber housing. The plasma source may include a plasma shaper extending into a plasma chamber from a wall of the chamber housing, wherein the plasma shaper includes a shaper wall coupled to the wall of the chamber housing, and a shaper end wall connected to the shaper wall, the shaper end wall defining an indentation extending towards the wall of the chamber.

In yet another embodiment, a gas distributor for a plasma chamber may include a gas inlet and a plasma shaper adjacent the gas inlet, wherein the plasma shaper extends into the plasma chamber. The plasma shaper may include a curved shaper end wall having a crest extending towards a wall of the chamber housing.

BRIEF DESCRIPTION OF THE DRAWINGS

By way of example, embodiments of the disclosure will now be described, with reference to the accompanying drawings, in which.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

A plasma source and ion beam surface modification system in accordance with the present disclosure will now be described more fully hereinafter with reference to the accompanying drawings, where embodiments of the disclosure are shown. The plasma source and ion beam surface modification system may be embodied in many different forms and are not to be construed as being limited to the embodiments set forth herein. Instead, these embodiments are provided so this disclosure will be thorough and complete, and will fully convey the scope of the system and method to those skilled in the art.

In view of the foregoing deficiencies identified with the prior art, provided herein are approaches for generating a more uniform ion flux and ion angular distribution across a wafer to minimize etch yield loss resulting from etch profile variation across the wafer. In some embodiments, a plasma shaper is provided within a chamber of a plasma source to create, for example, a donut-like (center dip) plasma profile. As a result, an ion flux signature at the wafer or the extraction grid of an ion beam source may be flipped from center-peaked to edge-peaked. In some embodiments, the plasma shaper is movable within the chamber in at least a first direction to adjust the plasma uniformity.

Figure 1:
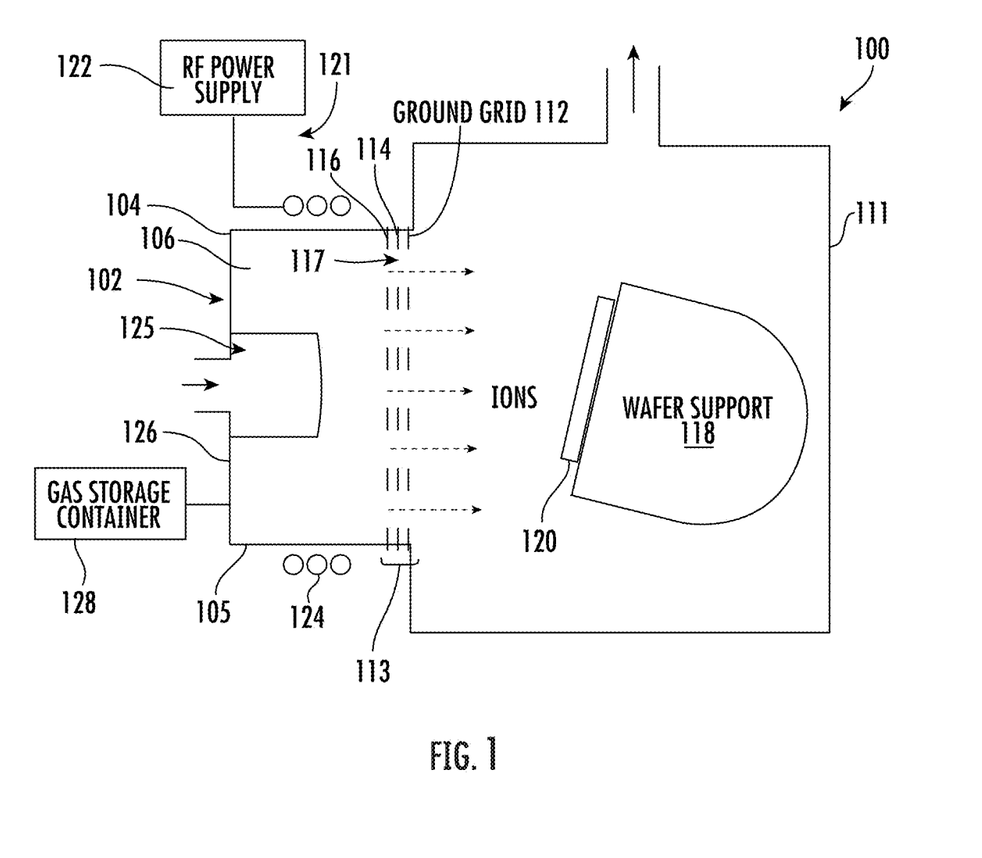
FIG. 1 is a schematic diagram of a system according to embodiments of the present disclosure.

Referring now to FIG. 1, an exemplary ion beam surface modification system (hereinafter "system") 100 in accordance with the present disclosure is shown. The system 100 may be an etching system including a plasma source 102 having a chamber housing 104 defining a plasma chamber 106 for generating a plasma therein. In some embodiments, the system 100 may be a radio frequency (RF) inductively coupled plasma (ICP) ion beam processing system mountable to a high vacuum substrate processing chamber 111, which includes a wafer support 118 and a wafer 120 for processing (e.g., etching).

As shown, the plasma chamber 106 may be separated from the processing chamber 111 by a grid assembly 113. When the grid assembly 113 is used in ion beam processing the wafer 106, energetic ions may be extracted from the grid assembly 113 by charging the plasma to a positive potential with respect to the process chamber ground via contact with a positively charged electrode, such as grid member 116, connected to a high voltage power supply. In other embodiments, the high voltage power supply may be connected to any sizeable electrode in contact with the plasma, e.g., a plasma shaper 125, which extends into the plasma chamber 106. In either case, the plasma potential will always be more positive than the positive electrode.

Furthermore, a second grid member 114 negatively charged with respect to ground may facilitate ion current extraction and suppress electron admission to the plasma chamber from the process chamber. A third grid member 112, which may be electrically grounded to the process chamber ground, may also be included to reduce ion beamlet divergence at some operating conditions. Among the three grid members, the ground grid member 112 may be disposed closest to the wafer 120 during etching the wafer, and the negative grid member 114 may be disposed between the ground grid member 112 and the positive grid member 116. Although non-limiting, the ground grid 112 may be made thicker than the negative grid member 114 and the positive grid member 116 for reinforcing structural robustness/rigidity of the grid assembly 113. Furthermore, spacing between the grid members of the grid assembly 113 may be optimized for desirable etch uniformity and etch rate. In other embodiments, the grid assembly may only include two grids, e.g., positive and negative with respect to process chamber ground, or may have three or more grids but none of the grids are electrically grounded. Embodiments herein are not limited in this context.

The plasma source 102 may further include a plasma generator 121 including a power supply 122 electrically coupled to the chamber housing 104, e.g., by a plurality of radio frequency coils (hereinafter "coils") 124, which are operable to excite gas in the plasma chamber 106 to generate ions (or charged particles). The gas may be supplied from gas storage container 128 via a flow regulator, e.g., a Mass Flow Controller. In embodiments, a plasma is generated by application of RF power (e.g., on the order of about kilowatt, in a frequency range of about 0.5-15 MHz) from the power supply 122, wherein the rf electrical current circulating in the coils 124 generates an axial magnetic field, which is transmitted to the plasma through the "window" along the sidewall 105 of the chamber housing 104. In other embodiments, the plasma may be generated in a different manner, such as by a filament, a capacitively coupled plasma (CCP) source, an indirectly heated cathode (IHC or another plasma source). In one example, the ion source 102 may be an IHC, while the power supply 134 is a DC power supply. However, the manner in which the plasma is generated is not limited by this disclosure.

In various embodiments, different species may be used for the feed gas from the gas storage container 128. Examples may include atomic or molecular species containing boron (B), carbon (C), oxygen (O), helium (He), neon (Ne), argon (Ar), krypton (Kr), nitrogen (N), hydrogen (H), fluorine (F), chlorine (Cl). Those of ordinary skill in the art will recognize the above listed species are non-limiting, and other atomic or molecular species may also be used. Depending on the application(s), the species may be used as the etchants, dopants or the additional material. In particular, one species used as the etchant in one application may be used as the additional material in another application, or vice-versa.

As further shown, the system 100 may include the plasma shaper 125 extending into the plasma chamber 106 from a wall 126 of the chamber housing 104. In some embodiments, the wall 126 may be opposite the grid assembly 113. As will be described in greater detail herein, the plasma shaper 125 may be a cylindrical and/or disc shaped component operable to improve plasma ion flux uniformity. Although only a single plasma shaper 125 is shown, it'll be appreciated that multiple plasma shapers may be possible. Furthermore, the plasma shaper(s) 125 may extend from a sidewall 105 of the plasma housing 104.

Figure 2A:
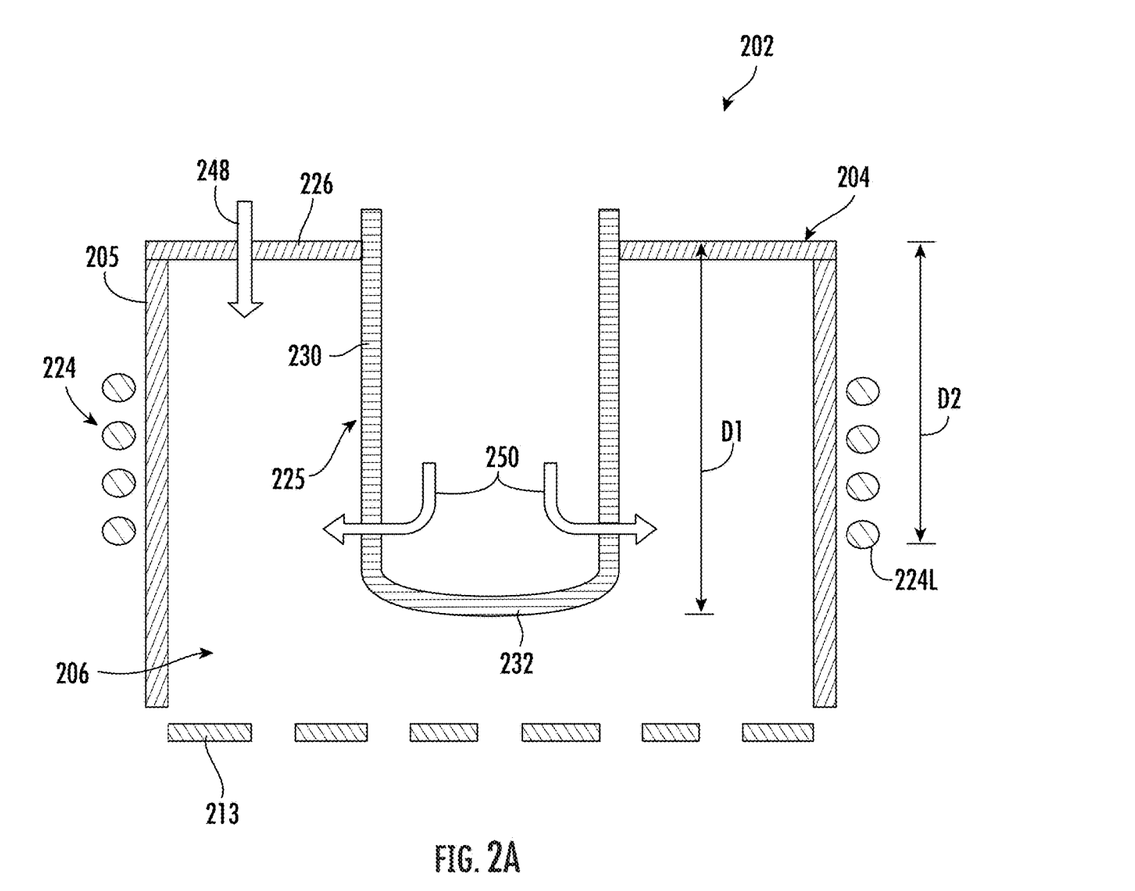
FIG. 2A is a side cross-sectional view of an ion source according to embodiments of the present disclosure.

Turning to FIG. 2A, a plasma source 202 according to an embodiment of the present disclosure will be described. As shown, the plasma source 202 may include a chamber housing 204 defining a plasma chamber 206, the chamber housing 204 including a sidewall 205 connected with an end wall 226. At an opposite end of the sidewall 205 from the end wall 226 is a grid assembly 213. A plasma shaper 225 may extend into the plasma chamber 206 from the end wall 226 of the chamber housing 204. As shown, the plasma shaper 225 may include a shaper wall 230 coupled to the end wall 226 of the chamber housing 204. The plasma shaper 225 may further include a shaper end wall 232 connected to, or integrally formed with, the shaper wall 230. Although non-limiting the plasma shaper 225 may generally be a cylindrical component extending towards the grid assembly 213.

Figure 2B:
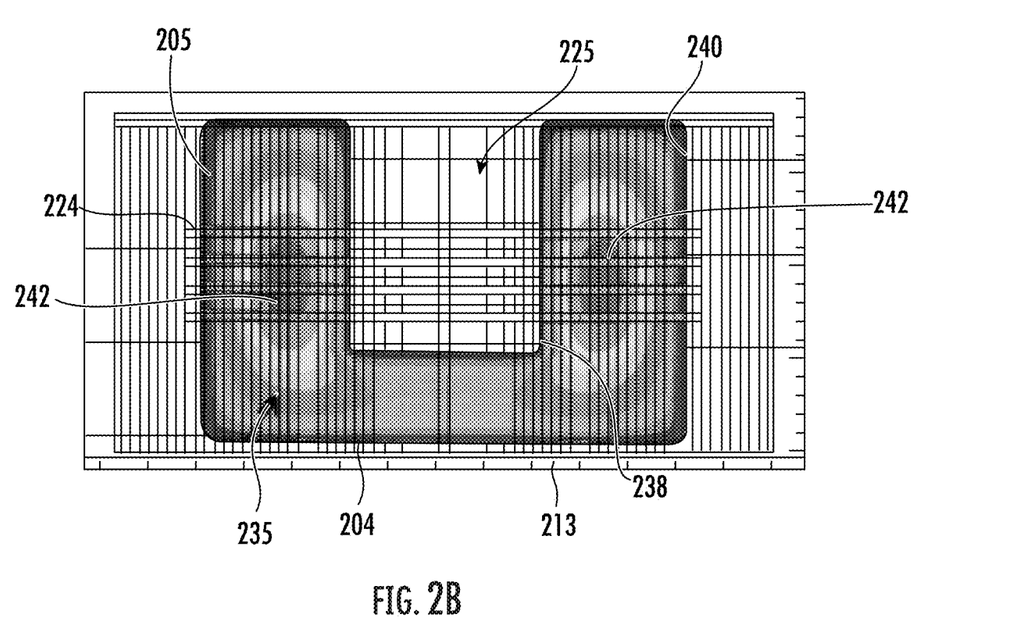
FIGS. 2B & 2C demonstrate plasma profiles of the ion source of FIG. 2A according to embodiments of the present disclosure.
Figure 2C:
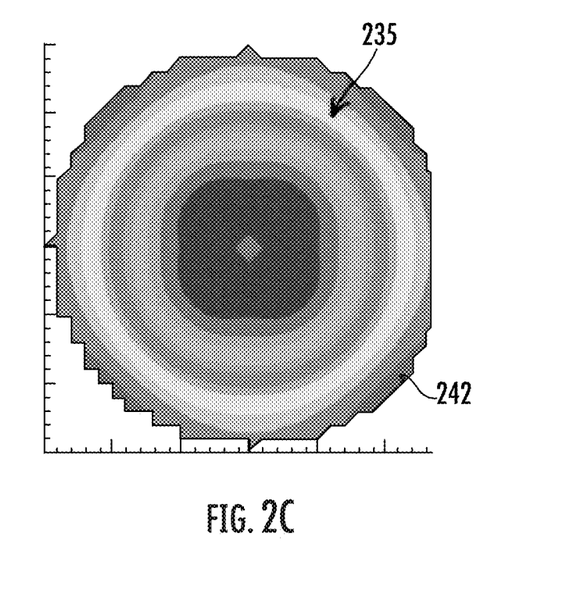

In the embodiment shown, the plasma shaper 225 may extend a first distance 'D1' into the plasma chamber 206. As shown, D1 may be greater than 'D2', which is a distance between the end wall 226 of the chamber housing 204 and a lowermost (in the orientation of FIG. 2A) coil 224L of a plurality of coils 224. Although not limited to any particular dimensions or configuration, D1 of the plasma shaper 225 may be approximately twice as large as a radius of the plasma shaper 225. By positioning the shaper end wall 232 closer to the grid assembly 213 than to the end wall 226 of the plasma housing 204, a donut-like (center dip) plasma profile may be generated. For example, as shown in the side view of FIG. 2B and the end view of FIG. 2C, a plasma profile 235 may demonstrate a greater density in areas 242, between an exterior surface 238 of the plasma shaper 225 and an inner surface 240 of the sidewall 205 of the chamber housing 204. The areas 242 are beneath or surrounded by the coils 224. As a result, an ion flux signature at the grid 213 is greater at the edges than at the center. In some embodiments, D1 of the plasma shaper 225 may be modified to alter the plasma density.

As further shown in FIG. 2A, the plasma source 202 may include one or more gas inlets operable to deliver a feed gas into the plasma chamber 206. In some embodiments, a first gas inlet 248 may extend through the chamber housing 204, such as through the end wall 226. Additionally, or alternatively, second gas inlets 250 may extend through the plasma shaper 225. Embodiments herein are not limited in this context, however.

Figure 3A:
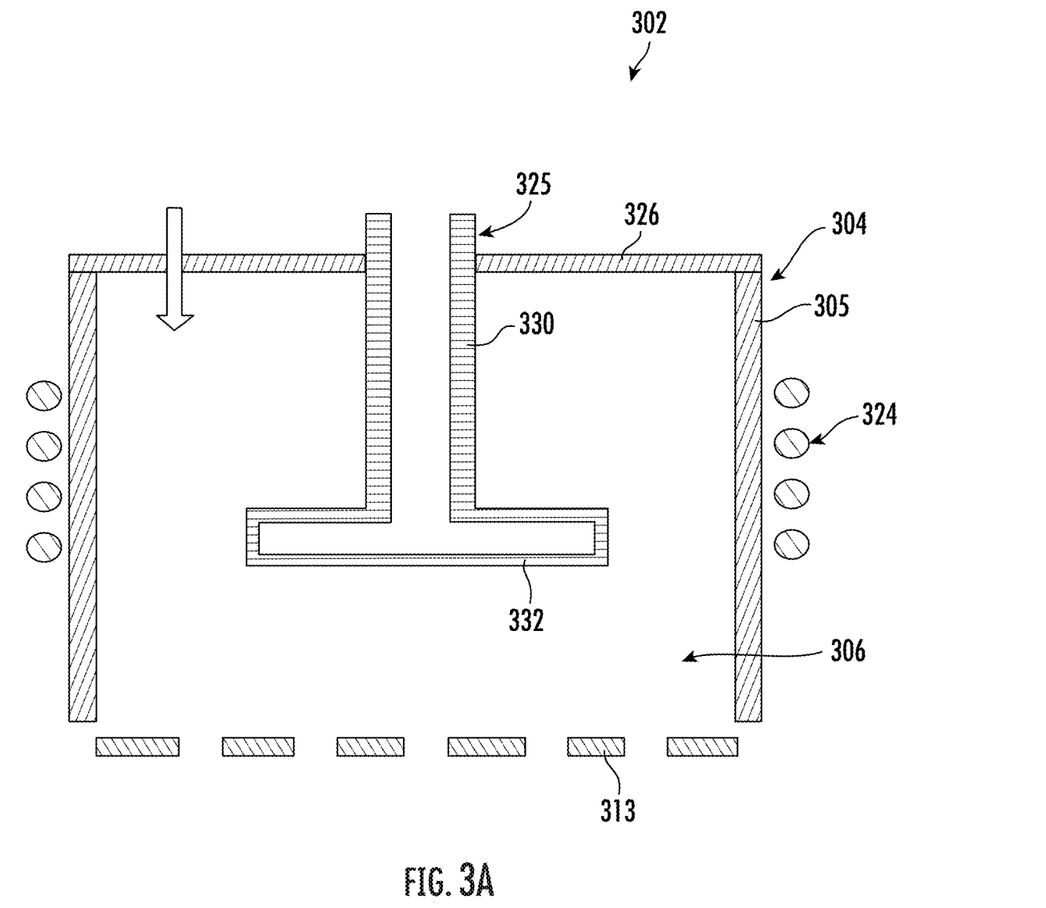
FIG. 3A is a side cross-sectional view of an ion source according to embodiments of the present disclosure.
Figure 3B:
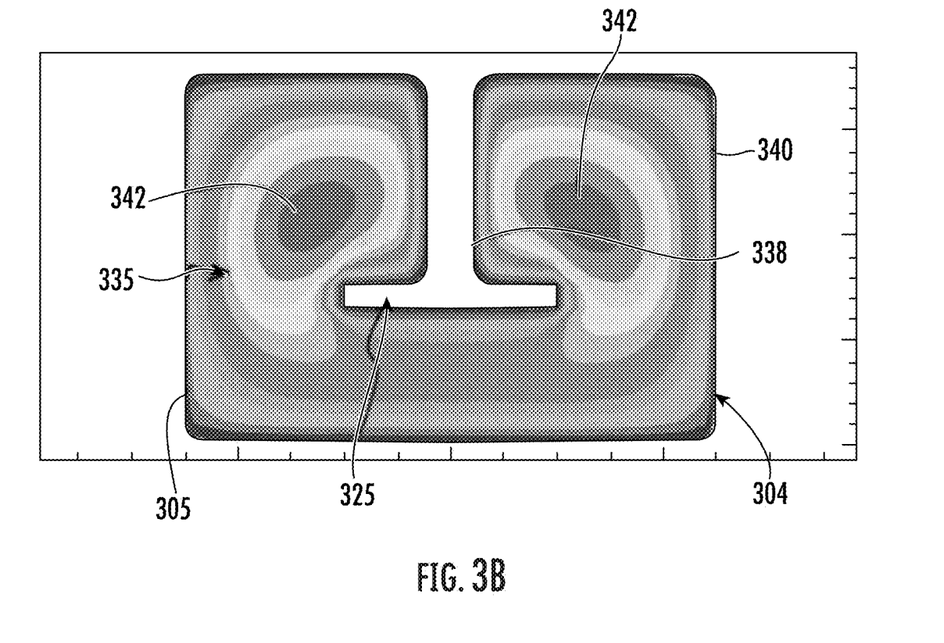
FIGS. 3B & 3C demonstrate plasma profiles of the ion source of FIG. 3A according to embodiments of the present disclosure.
Figure 3C:
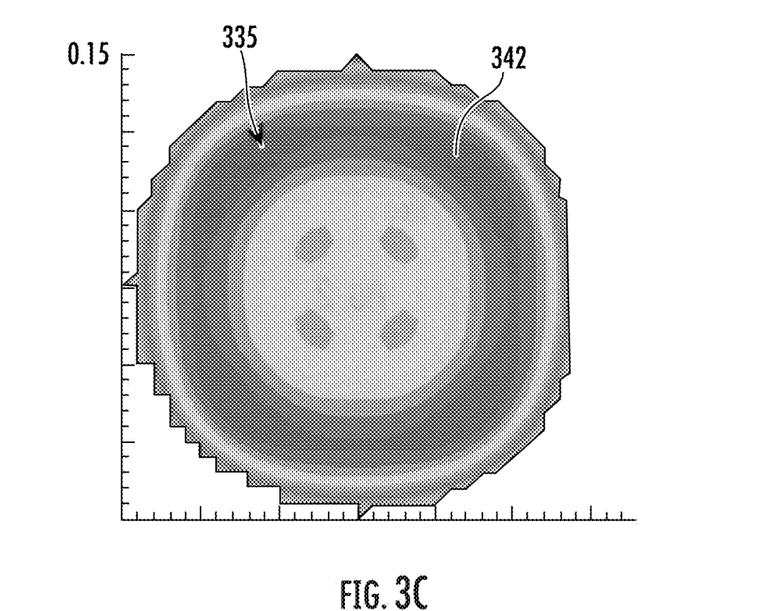

FIGS. 3A-3C demonstrate another plasma source 302 according to embodiments of the present disclosure. As shown, the plasma source 302 may include a chamber housing 304 defining a plasma chamber 306, the chamber housing 304 including a sidewall 305 connected with an end wall 326. At an opposite end of the sidewall 305 from the end wall 326 is a grid assembly 313. The plasma source 302 may include a plurality of coils 324 extending around an exterior of the sidewall 305.

A plasma shaper 325 may extend into the plasma chamber 306 from the end wall 326 of the chamber housing 304. As shown, the plasma shaper 325 may include a shaper wall 330 coupled to the end wall 326 of the chamber housing 304. The plasma shaper 325 may further include a shaper end wall 332 connected to, or integrally formed with, the shaper wall 330. In some embodiments, the shaper wall 330 is a cylindrical shaft and the shaper end wall 332 is a disc-shaped flange. As shown, the flange may be generally wider than the cylindrical shaft. That is, the flange may be closer to the sidewall 305 of the chamber housing 304 than the cylindrical shaft is to the sidewall 305.

As shown in FIGS. 3B-3C, a plasma profile 335 may demonstrate a greater density in areas 342, between an exterior surface 338 of the plasma shaper 325 and an inner surface 340 of the sidewall 305 of the chamber housing 304. The areas 342 are generally beneath or surrounded by the coils 324 (FIG. 3A). The disc-shaped plasma shaper 325 in this embodiments allows more volume for plasma, with the plasma density peaked away from the grid assembly 313. Furthermore, less material is exposed to back-sputtering from the process chamber.

Figure 4:
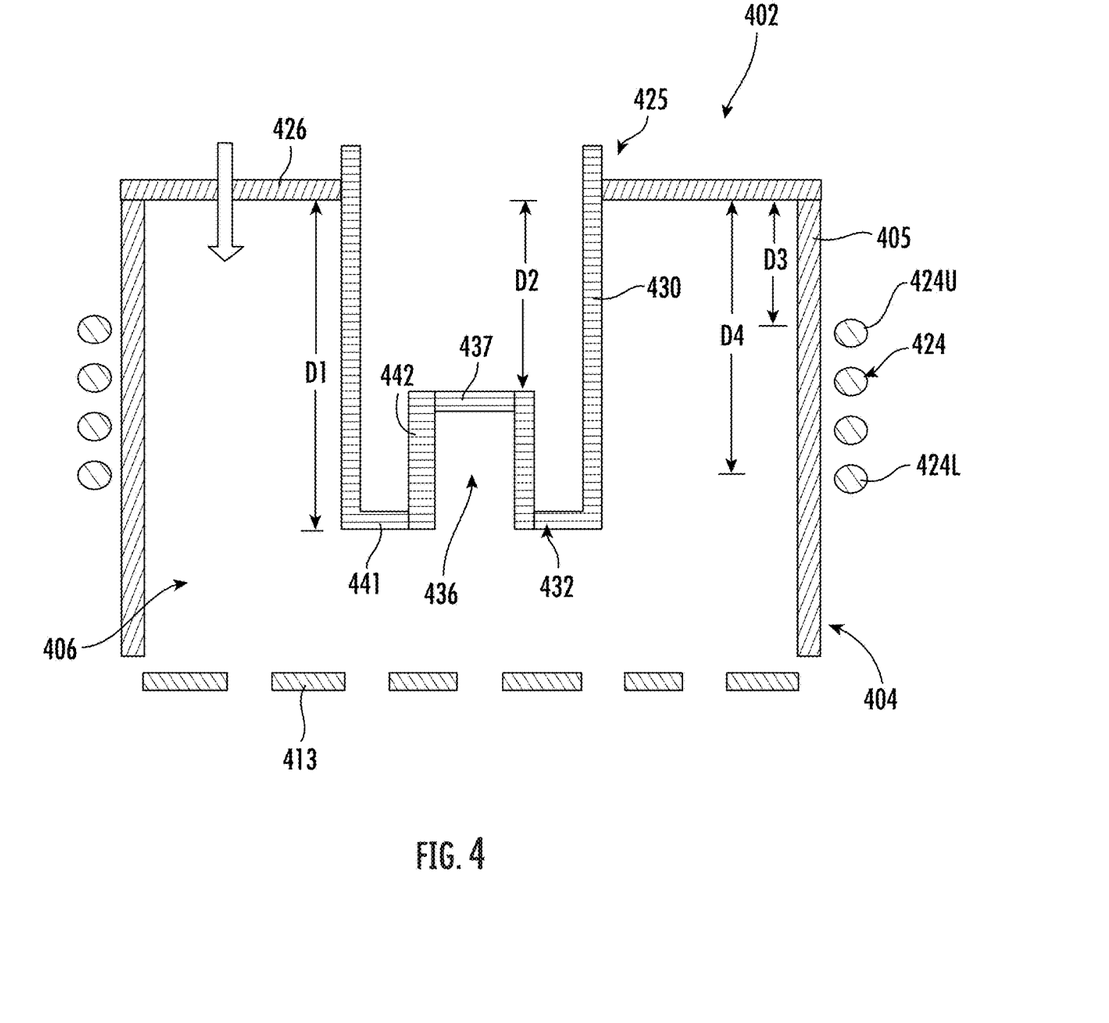
FIG. 4 is a side cross-sectional view of an ion source according to embodiments of the present disclosure.

FIG. 4 demonstrates another plasma source 402 according to embodiments of the present disclosure. As shown, the plasma source 402 may include a chamber housing 404 defining a plasma chamber 406, the chamber housing 404 including a sidewall 405 connected with an end wall 426. At an opposite end of the sidewall 405 from the end wall 426 is a grid assembly 413. The plasma source 402 may include a plurality of coils 424 extending around an exterior of the sidewall 405.

A plasma shaper 425 may extend into the plasma chamber 406 from the end wall 426 of the chamber housing 404. As shown, the plasma shaper 425 may include a shaper wall 430 coupled to the end wall 426 of the chamber housing 404. The plasma shaper 425 may further include a shaper end wall 432 connected to, or integrally formed with, the shaper wall 430. As shown, the shaper end wall 432 may include an indentation, recess, or cavity 436 with a protrusion or peak 437 or extending towards the end wall 426 of the chamber housing 404 and away from the grid assembly 413. Although non-limiting, the shaper end wall 432 may include a set of horizontal elements 441 connected with a set of inner vertical elements 442, wherein the set of horizontal elements 441 may generally extend perpendicular to the set of inner vertical elements 442. Although the set of vertical elements 441 are shown as extending parallel to one another, embodiments herein are not limited in this context. The cavity 436 may be cylindrical-shaped in some embodiments. In other embodiments, the cavity 436 may take on virtually any shape or profile.

The horizontal elements 441 of the shaper end wall 432 may extend a first distance 'D1' into the plasma chamber 406 from the end wall 426, while the peak 437 defining the cavity 436 may extend a second distance 'D2' from the end wall 426. As shown, D2 may be greater than 'D3', which is a distance between the end wall 426 and an uppermost (in the orientation of FIG. 4) coil 424U of the plurality of coils 424. Meanwhile, D2 may be less than 'D4', which is a distance between the end wall 426 and a lowermost coil 424L of the plurality of coils 424. As a result, the cavity 436 may be surrounded, at least in part, by the plurality of coils 424. It will be appreciated that D1-D4 are variable. By providing the central cavity 436 in the plasma shaper 425, the center dip in the plasma density in the plasma chamber 406 as described in reference to FIG. 2 for the case of the shaper end wall close to the grid assembly 213, may be locally reduced in a core center region as desired while still maintaining a higher plasma density at the edges, resulting in an overall more uniform ion flux distribution at the grid.

Figure 5:
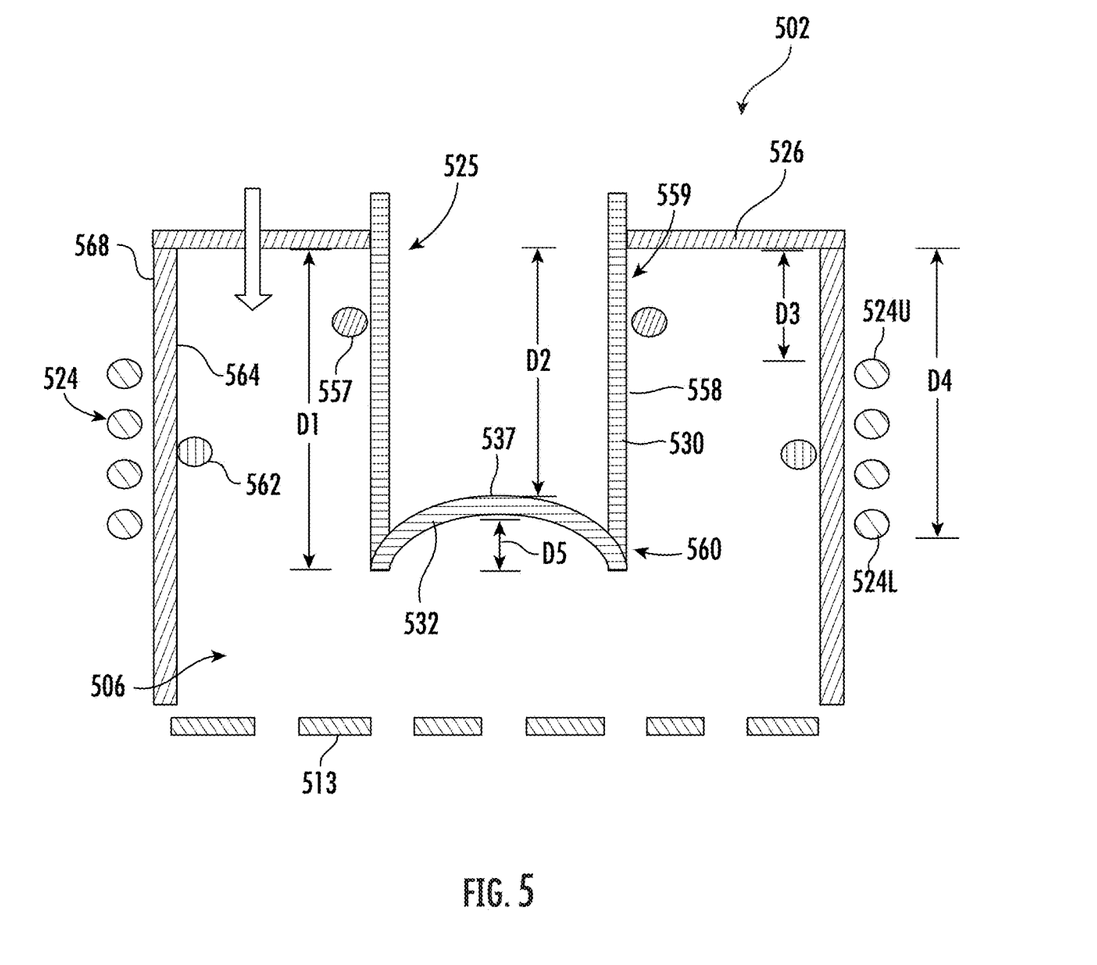
FIG. 5 is a side cross-sectional view of an ion source according to embodiments of the present disclosure.

FIG. 5 demonstrates another plasma source 502 according to embodiments of the present disclosure. A plasma shaper 525 may extend into a plasma chamber 506 from an end wall 526 of a chamber housing 504. As shown, the plasma shaper 525 may include a shaper wall 530 coupled to the end wall 526 of the chamber housing 504. The plasma shaper 525 may further include a shaper end wall 532 connected to, or integrally formed with, the shaper wall 530. As shown, the shaper end wall 532 may include an indentation, recess, or cavity 536 with a crest or peak 537 extending towards the end wall 526 of the chamber housing 504. Although non-limiting, the shaper end wall 532 may have a hemispherical shape/semicircular profile.

The shaper wall 530 may extend a first distance 'D1' into the plasma chamber 506 from the end wall 526, while the peak 537 of the shaper end wall 532 may be positioned a second distance 'D2' from the end wall 526. As shown, D2 may be greater than 'D3', which is a distance between the end wall 526 and an uppermost (in the orientation of FIG. 5) coil 524U of the plurality of coils 524. Meanwhile, D2 may be less than 'D4', which is a distance between the end wall 526 and a lowermost coil 524L of the plurality of coils 524. As a result, the cavity 536 may be surrounded, at least in part, by the plurality of coils 524. It will be appreciated that D1-D4 are variable. For example, D2 may be less than D3, such that the peak 537 extends above the uppermost coil 524U. Alternatively, D2 may be greater than D4 such that the peak 537 is below the lowermost coil 524L. Furthermore, a depth 'D5' of the cavity 536 may be modified as desired. As shown, D5 may generally be equal to D2 subtracted from D1. By providing the central cavity 536 in the plasma shaper 525, the ion flux towards a center of the plasma chamber 506 may be increased.

As further shown, the plasma source 502 may include a first shaper ring 557 extending circumferentially around an exterior 558 of the shaper wall 530 of the plasma shaper 525. In some embodiments, the first shaper ring 557 may be positioned proximate a first end 559 of the shaper wall 530. In other embodiments, the first shaper ring 557 may be positioned proximate a second end 560 of the shaper wall 530. As shown, the first end 559 of the shaper wall 530 is adjacent the end wall 526 of the plasma housing 504 while the second end 560 of the shaper wall 530 is adjacent a grid assembly 513. It will be appreciated that more than one shaper ring 557 may be present around the shaper wall 530.

In some embodiments, the plasma source 502 may further include a second shaper ring 562 extending around an interior surface 564 of the chamber housing 504. Similar to the first shaper ring 557, a position of the second shaper ring 562 along the interior surface 564 may vary to further influence the ion flux profile within the plasma chamber 506, as desired. More than one shaper ring 562 may be present along the interior surface 564. In some embodiments, one or more shaper rings may be located along an exterior surface 568 of the chamber housing 504. It will be appreciated that the first and/or second shaper rings 557, 562 may be present in any of the plasma sources (e.g., 102, 202, 302, 402) described herein.

Figure 6:
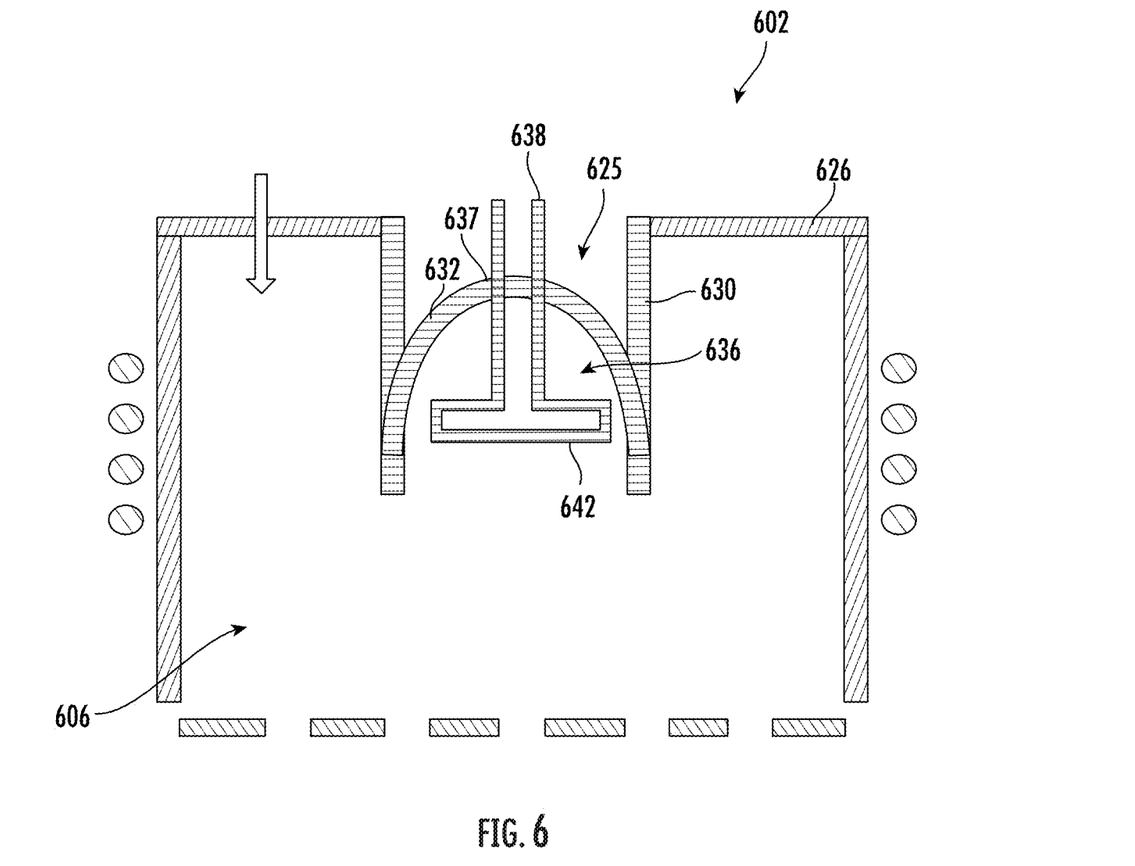
FIG. 6 is a side cross-sectional view of an ion source according to embodiments of the present disclosure.

FIG. 6 demonstrates another plasma source 602 according to embodiments of the present disclosure. A plasma shaper 625 may extend into a plasma chamber 606 from an end wall 626 of a chamber housing 604. As shown, the plasma shaper 625 may include a shaper wall 630 and a shaper end wall 632 connected to, or integrally formed with, the shaper wall 630. As shown, the shaper end wall 632 may include an indentation, recess, or cavity 636 with a peak 637 extending towards the end wall 626 of the chamber housing 604. Although non-limiting, the shaper end wall 632 may have a hemispherical shape/semicircular profile.

As shown, the plasma shaper 625 may further include a second shaper wall 638 coupled to, or extending through, the shaper end wall 632. Connected to the second shaper wall 638 may be a disc-shaped flange 642, which is located within the cavity 636. The end of flange 642 may also be concave or convex shaped rather than disc shaped. It will be appreciated that the dimensions and/or distances of the components of the plasma shaper 625 relative to one another may vary to influence the plasma profile within the plasma chamber 606. Furthermore, in some embodiments, the flange 642 may be movable relative to the shaper end wall 632 to modify a plasma profile from center focused to edge-peaked.

Although not shown, a cusp magnet or electromagnet may be combined with any of the plasma sources described herein to improve plasma ion flux uniformity. For example, a cusp magnet may be placed around an exterior of the chamber housing to add an external magnetic field, which improves uniformity. More specifically, axial cusp fields generated by the cusp magnet may improve uniformity by reducing edge losses.

Figure 7A:
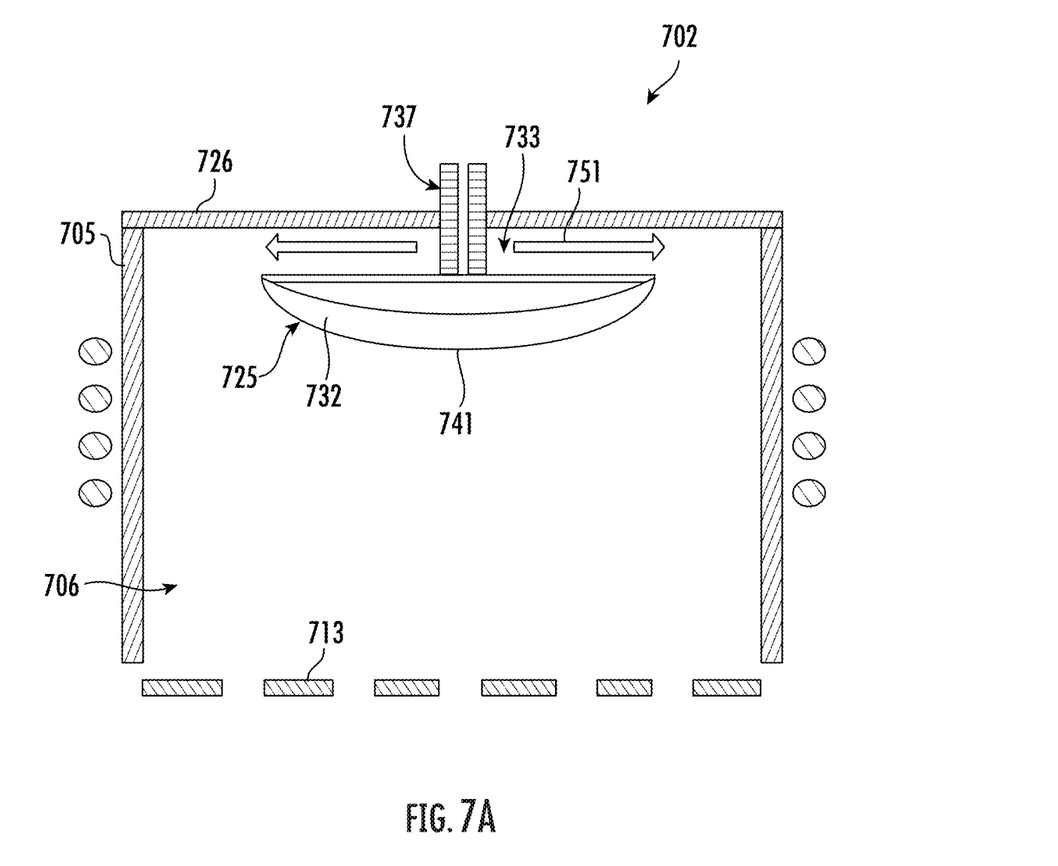
FIG. 7A is a side cross-sectional view of an ion source according to embodiments of the present disclosure.
Figure 7B:
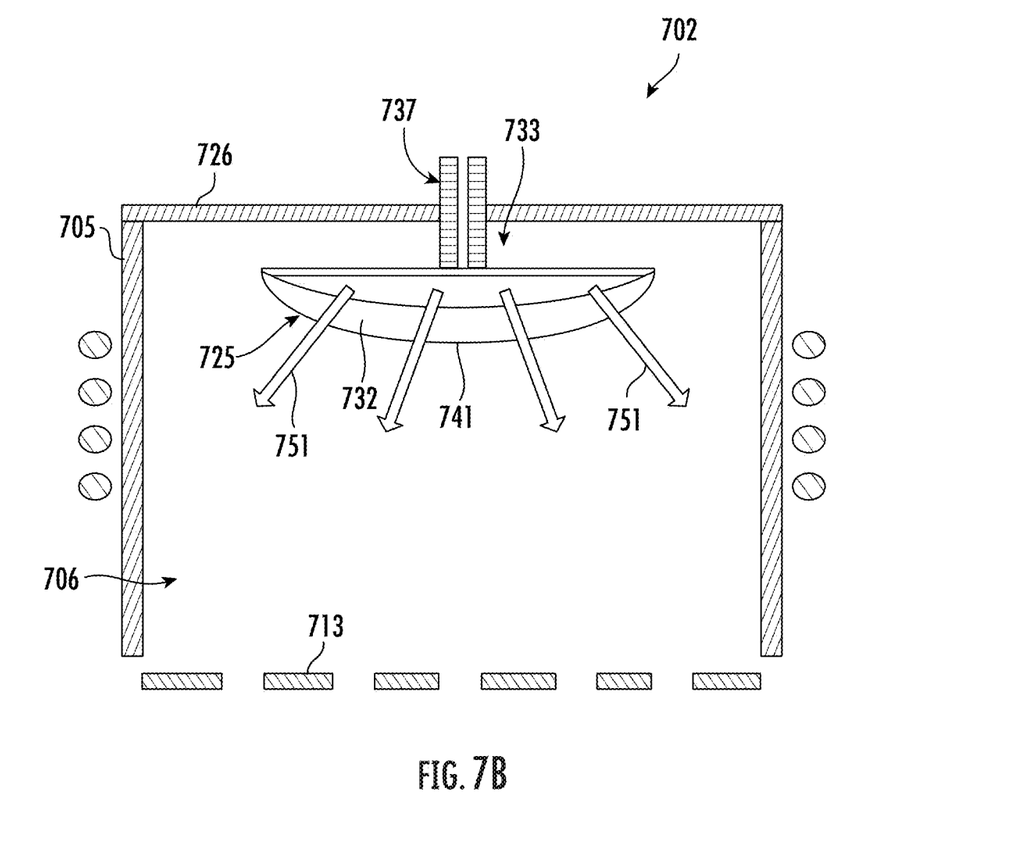
FIG. 7B is a side cross-sectional view of an ion source according to embodiments of the present disclosure.

Turning to FIGS. 7A-7B, a plasma source 702 according to embodiments of the present disclosure will be described. As shown, the plasma source 702 may include a chamber housing 704 defining a plasma chamber 706, the chamber housing 704 including a sidewall 705 connected with an end wall 726. The plasma source 702 may include a gas distributor 733 including a gas inlet 737 and a plasma shaper 725, the plasma shaper 725 extending into the plasma chamber 706 from the end wall 726 of the chamber housing 704. As shown, the plasma shaper 225 may include a curved shaper end wall 732 having a peak or crest 741 extending towards a grid assembly 713.

During use, the gas distributor 733 is operable to deliver a feed gas 751 into the plasma chamber 706. In the embodiment of FIG. 7A, the feed gas 751 is delivered between the curved shaper end wall 732 and the end wall 726, in an initial direction which is substantially parallel to the end wall 726. In the embodiment of FIG. 7B, the feed gas 751 is delivered through one or more conduits in the curved shaper end wall 732 of the plasma shaper 725. It will be appreciated that the location and number of conduits may be varied to influence feed gas distribution, and therefore plasma density, within the plasma chamber 706.

Figure 8:
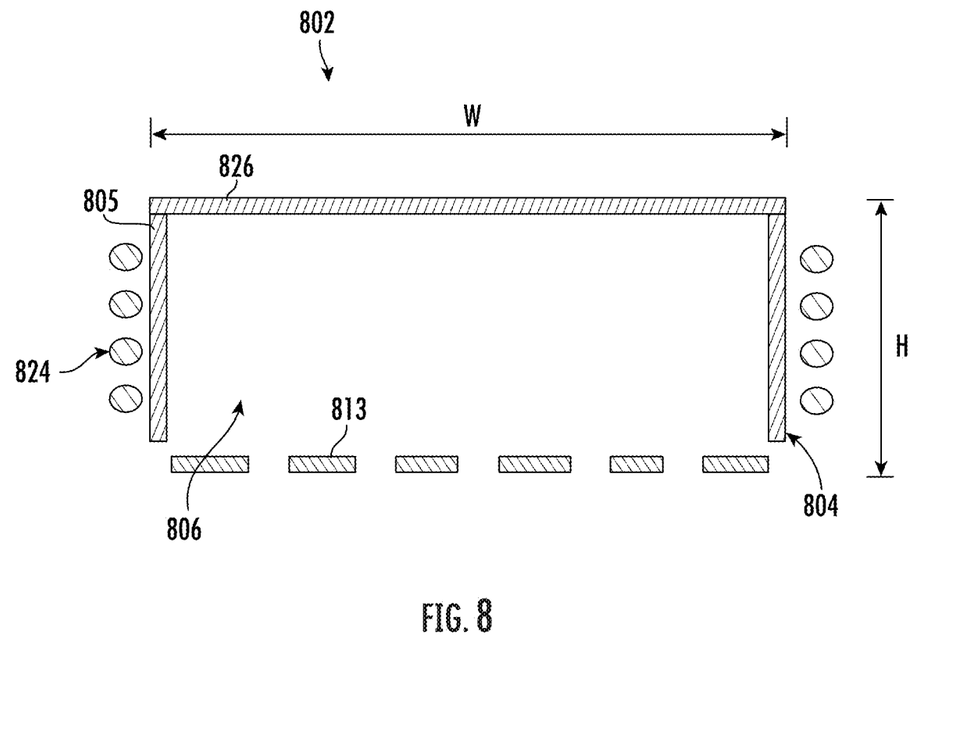
FIG. 8 is a side cross-sectional view of an ion source according to embodiments of the present disclosure.

FIG. 8 demonstrates another plasma source 802 according to embodiments of the present disclosure. As shown, the plasma source 802 may include a chamber housing 804 defining a plasma chamber 806, the chamber housing 804 including a sidewall 805 connected with an end wall 826. At an opposite end of the sidewall 805 from the end wall 826 is a grid assembly 813. A plurality of coils 824 may extend around the sidewall 805. Although not shown, the plasma source 802 may include one or more gas inlets operable to deliver a feed gas into the plasma chamber 806.

As further shown, the plasma source 806 may have a height 'H' and a width 'W'. In some embodiments, a height/diameter aspect ratio of 0.4 or lower starts to show benefits not observed for a more typical aspect ratio range, e.g., 1-2. Furthermore, it has been observed by the inventors that a donut shaped plasma density distribution may be achieved at an aspect ratio of 0.2. In some non-limiting examples, peak flux may drop from approximately $1.67*10^{20}$ $1/m^2/s$ for a height dimension of 200 mm to approximately $1.28*10^{20}$ $1/m^2/s$ for a height dimension of 100 mm. The plasma uniformity profile may change to the donut shape at approximately 100 mm bowl height.

The foregoing discussion has been presented for purposes of illustration and description and is not intended to limit the disclosure to the form or forms disclosed herein. For example, various features of the disclosure may be grouped together in one or more aspects, embodiments, or configurations for the purpose of streamlining the disclosure. However, it should be understood that various features of the certain aspects, embodiments, or configurations of the disclosure may be combined in alternate aspects, embodiments, or configurations. Moreover, the following claims are hereby incorporated into this Detailed Description by this reference, with each claim standing on its own as a separate embodiment of the present disclosure.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

All directional references (e.g., proximal, distal, upper, lower, upward, downward, left, right, lateral, longitudinal, front, back, top, bottom, above, below, vertical, horizontal, radial, axial, clockwise, and counterclockwise) are only used for identification purposes to aid the reader's understanding of the present disclosure, and do not create limitations, particularly as to the position, orientation, or use of this disclosure. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other.

Furthermore, identification references (e.g., primary, secondary, first, second, third, fourth, etc.) are not intended to connote importance or priority, but are used to distinguish one feature from another. The drawings are for purposes of illustration only and the dimensions, positions, order and relative sizes reflected in the drawings attached hereto may vary.

Still furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

What is claimed is:

1. A system, comprising:
   a plasma source configured to generate a plasma within a plasma chamber enclosed by a chamber housing, wherein the plasma chamber housing is defined by a sidewall connected with an end wall, and wherein the plasma source comprises:
   a plasma shaper extending into the plasma chamber from the end wall of the chamber housing, wherein the plasma source is a radio frequency inductively coupled plasma source, and wherein the plasma shaper comprises:
      a shaper wall coupled to the end wall of the chamber housing; and
      a shaper end wall connected to the shaper wall, the shaper end wall defining an indentation extending towards the end wall of the chamber housing;
   a plurality of coils extending around the chamber housing, wherein the plasma shaper extends a first distance into the plasma chamber from the end wall of the chamber housing, wherein a lowermost coil of the plurality of coils is positioned a second distance away from the end wall of the chamber housing, and wherein the first distance is greater than the second distance; and
   a shaper ring extending around an interior surface of the sidewall of the chamber housing, wherein the shaper ring is surrounded by the plurality of coils.

2. The system of claim 1, wherein the system further comprises a processing chamber configured to house a wafer, wherein a grid assembly of the plasma source separates the plasma chamber from the processing chamber.

3. The system of claim 1, further comprising a gas inlet extending through the chamber housing.

4. The system of claim 1, wherein the indentation comprises a cylindrical-shaped recess or a hemispherical-shaped recess.

5. The system of claim 1, wherein the chamber housing has a height dimension and a radial dimension, and wherein an aspect ratio of the height dimension to the radial dimension is 0.4 or less.

6. The system of claim 1, the plasma source further comprising a second shaper ring extending around an exterior of the shaper wall of the plasma shaper.

7. An ion beam processing system, comprising:
   a plasma source configured to generate a plasma within a chamber housing, wherein the plasma chamber housing is defined by a sidewall connected with an end wall, and wherein the plasma source is a radio frequency inductively coupled plasma source; and
   an extraction power assembly including a high voltage power supply electrically coupled to the chamber housing, wherein the plasma source comprises a plasma shaper extending into a plasma chamber from end wall of the chamber housing, and wherein the plasma shaper comprises:
      a shaper wall coupled to the end wall of the chamber housing; and
      a shaper end wall connected to the shaper wall, the shaper end wall defining an indentation extending towards the end wall of the chamber housing;
   a plurality of coils extending around the chamber housing, wherein the plasma shaper extends a first distance into the plasma chamber from the wall of the chamber housing, wherein a lowermost coil of the plurality of coils is positioned a second distance away from the wall of the chamber housing, and wherein the first distance is greater than the second distance; and
   a shaper ring extending around an interior surface of the sidewall of the chamber housing, wherein the shaper ring is surrounded by the plurality of coils.

8. The ion beam processing system of claim 7, wherein the indentation comprises a cylindrical-shaped recess or a hemispherical-shaped recess, and wherein a peak of the cylindrical-shaped recess or the hemispherical-shaped recess is surrounded by the plurality of coils.

9. The ion beam processing system of claim 7, further comprising a gas inlet extending through the chamber housing.

10. The ion beam processing system of claim 7, the plasma source further comprising a second shaper ring extending around an exterior of the shaper wall of the plasma shaper.

* * * * *